(12) United States Patent  
Kodama

(10) Patent No.: US 7,161,855 B2  
(45) Date of Patent: Jan. 9, 2007

(54) SEMICONDUCTOR MEMORY DEVICE AND TIMING CONTROL METHOD

(75) Inventor: Tsuyoshi Kodama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/943,000

(22) Filed: Sep. 17, 2004

(65) Prior Publication Data

US 2005/0207239 A1    Sep. 22, 2005

(30) Foreign Application Priority Data

Mar. 18, 2004    (JP)  ............................. 2004-078416

(51) Int. Cl.
  *G11C 7/00*    (2006.01)
(52) U.S. Cl. ...................... 365/194; 365/200
(58) Field of Classification Search ................ 365/194, 365/200
  See application file for complete search history.

(56) References Cited

U.S. PATENT DOCUMENTS 6,172,916 B1 *    1/2001   Ooishi ................... 365/189.02
6,201,757 B1 *    3/2001   Ward et al. ............. 365/230.05
6,410,379 B1 *    6/2002   Wahlstrom .................. 438/222
6,646,938 B1 *   11/2003   Kodama .................... 365/210

FOREIGN PATENT DOCUMENTS

JP    2002-109887    4/2002

* cited by examiner

*Primary Examiner*—Michael Tran
(74) *Attorney, Agent, or Firm*—Arent Fox PLLC

(57) ABSTRACT

A semiconductor memory device for suitably controlling the timing for accessing data in a memory cell. The semiconductor memory device includes a memory cell. A bit line, connected to the memory cell, is used to access data stored in the memory cell. A first path for generating a first timing signal includes a dummy cell for storing data. A dummy bit line, connected to the dummy cell, is used to access the data stored in the dummy cell. A second path for generating a second timing signal has a delay characteristic differing from that of the first path. A control circuit controls the timing for accessing the data stored in the memory cells using one of the first timing signal and the second timing signal.

12 Claims, 6 Drawing Sheets

Erroneous Operation

SEMICONDUCTOR MEMORY DEVICE AND TIMING CONTROL METHOD

CROSS-REFERENCE TO RELATED APPLICATIONS

This application is based upon and claims the benefit of priority from prior Japanese Patent Application No. 2004-078416, filed on Mar. 18, 2004, the entire contents of which are incorporated herein by reference.

BACKGROUND OF THE INVENTION

The present invention relates to a semiconductor memory device and timing control method for a semiconductor memory device, and more specifically, to a semiconductor memory device including a control circuit for controlling the timing for amplifying a data signal.

Semiconductor memory devices of recent years have seen increasing integration and higher operation speeds. Differences that arise during the manufacturing process of semiconductor memory devices lead to deviation in operation timings in circuits. Therefore, it is necessary to ensure the proper operation timing by taking into consideration the differences arising from the manufacturing process.

When data is read from the memory cell of a semiconductor memory device, a sense amplifier is activated after the signal amplitude of a bit line or data bus becomes large enough. Each circuit of a semiconductor memory device is affected by differences arising from the manufacturing process. To compensate for improper functioning of a sense amplifier caused by such differences, there is a predetermined margin for the activation time of the sense amplifier.

Japanese Laid-Open Patent Publication No. 2002-109887 describes an example of a semiconductor memory device provided with a delay circuit, which includes an inverter circuit. The delay circuit generated a signal for activating a sense amplifier. The delay circuit delays the timing for activating the sense amplifier so that the sense amplifier functions properly.

FIG. 1 shows the circuit configuration of a conventional semiconductor memory device 1.

The semiconductor memory device 1 includes a memory cell array 11, a word line driver 12, a column switch 13, a write amplifier 14, a sense amplifier 15, an input circuit 16, an output circuit 17, and a timing control circuit 18.

A plurality of memory cells 21 are arranged in the memory cell array 11. Each memory cell 21 is connected to the word line driver 12 through a word line WL, and connected to the column switch 13 through bit lines (bit line pair BL/XBL). The word line driver 12 selects one of a plurality of word lines WL based on an address. The column switch 13 receives a selection signal SEL from the timing control circuit 18 and connects a certain bit line BL and XBL to the write amplifier 14 or sense amplifier 15 based on the selection signal SEL.

Address, clock, and control signals are provided to the timing control circuit 18. The timing control circuit 18 executes timing controls necessary for accessing data stored in the memory cells 21 based on the address, clock, and control signals. The timing control circuit 18 has a delay circuit 18a, which includes a plurality of inverter circuits. The delay circuit 18a provides an activation signal STA to the sense amplifier 15.

FIGS. 2A and 2B are operation waveform diagrams of the semiconductor memory device 1 shown in FIG. 1.

As shown in FIG. 2A, when a word line WL is selected by the word line driver 12 (the word line WL is activated at high (H) level), the bit lines BL and XBL are driven based on the data stored in the memory cell 21. Thereafter, the electric potential of either the bit line BL or XBL (potential of the bit line XBL in FIG. 2A) is gradually reduced to ground level from the high-potential level of a power supply voltage VDD. When a predetermined time elapses after the activation of the word line WL, the timing control circuit 18 provides the activation signal STA to the sense amplifier 15. More specifically, the activation signal STA of the sense amplifier 15 is raised from low (L) level to high (H) level at a timing obtained by adding a predetermined margin to timing t1 at which the potential of the bit line XBL is sufficiently reduced to allow accurate reading of data. Then, the high activation signal STA activates the sense amplifier 15 to amplify the difference in the potential of the bit lines BL and XBL and read the data of the corresponding memory cell 21.

In the prior art, a self-timing type RAM has been proposed. As shown in a semiconductor memory device 2 of FIG. 3, the self-timing type RAM is provided with dummy circuits (circuits such as a dummy word line DWL, a dummy cell 22, dummy bit lines DBL and XDBL) to eliminate operation margins and absorb the manufacturing process differences of various circuits such as the word line WL, the memory cell 21, and the bit lines BL and XBL. In the semiconductor memory device 2, the dummy circuits operate in the same manner as normal circuits (circuits such as the word line WL, the memory cell 21, the bit line pair BL and XBL). The dummy circuit provides a dummy signal to a dummy timing control circuit 20.

The dummy timing control circuit 20 includes, for example, an inverter circuit, and provides the timing control circuit 18 with a self-reset signal STCLK, which corresponds to the level of the dummy signal. The timing control circuit 18 generates an activation signal STA based on the self-reset signal STCLK and activates the sense amplifier 15 with the activation signal STA.

FIGS. 4A and 4B are operation waveform diagrams of the semiconductor memory device 2 shown in FIG. 3.

As shown in FIG. 4A, when the word line WL is selected, the potential of one of the bit line pairs BL and XBL (potential of the bit line XBL in FIG. 4A) is gradually reduced to the ground level from the high-potential level of a power supply voltage VDD based on the memory data of the memory cell 21. Since the dummy word line DWL is also selected at the same time as the word line WL, the potential of the dummy bit line XDBL is also gradually reduced to ground level from the level of the power supply voltage VDD. When the potential of the dummy bit line XDBL becomes lower than a threshold voltage value Vth (more specifically, the threshold voltage of an inverter circuit in the dummy timing control circuit 20), the dummy timing control circuit 20 provides the timing control circuit 18 with a high self-reset signal STCLK. The timing control circuit 18 then provides the sense amplifier 15 with a high activation signal STA in response to the self-reset signal STCLK to activate the sense amplifier 15.

SUMMARY OF THE INVENTION

In the semiconductor memory device 1 of FIG. 1, for example, differences resulting from the manufacturing process may decelerate the operation of a circuit. That is, the potential of a bit line may change at a speed that is slower than the desired speed. In this case, the delay time of the delay circuit 18a cannot follow the slowed change in potential. More specifically, the delay time of the reading operation of the bit lines BL and XBL is determined only by the characteristics of a transistor in a memory cell unit. The delay time of a multi-stage inverter circuit is determined by the characteristics of a plurality of transistors that affect each other in a multi-stage inverter circuit. Accordingly, the range of change in the delay time of the inverter circuit is narrower than the range of change of the delay time of the memory cell unit. Therefore, the delay circuit 18a cannot follow the change in the delay time of the reading operation of the memory cell 21. For example, as shown in FIG. 2B, the timing control circuit 18, which includes the delay circuit 18a, shifts the activation signal STA of the sense amplifier 15 to a high level to start the sense amplifier 15 at time t0, which is earlier than the optimum timing t1. Since the amplitude of the bit line BL and XBL is small at time t0, the sense amplifier 15 cannot accurately read data.

In the self-timing type semiconductor memory device 2 shown in FIG. 3, the signal waveform of the dummy bit line XDBL becomes extremely gradual due to the actuation of the dummy cell 22, which has a small capability for driving the dummy bit lines DBL and XDBL that have large capacities. When there is a change in the threshold voltage Vth (threshold voltage of the inverter circuit) of the dummy timing control circuit 20 that receives the signal of the dummy bit line XDBL signal, the delay time fluctuates largely in accordance with the change in the threshold voltage Vth. The dummy bit lines DBL and XDBL are designed so that they operate following the operation of the normal bit lines BL and XBL. Thus, the dummy bit lines DBL and XDBL are sensitive to and greatly fluctuate in accordance with differences arising from the manufacturing process. Further, fluctuations resulting from the manufacturing process also change the threshold voltage Vth of the inverter circuit.

In the semiconductor memory device 2, for example, differences resulting from the manufacturing process may accelerate the operation of a circuit. That is, the potential of a bit line and a dummy bit line may change at a speed that is faster than the desired speed. In this case, the threshold voltage of the dummy timing control circuit 20 decreases, and the dummy timing control circuit 20 generates a high self-reset signal STCLK at a faster timing. Therefore, the timing control circuit 18 provides the activation signal STA to the sense amplifier 15 before the optimum time t1, as shown in FIG. 4B. As a result, the sense amplifier 15 cannot read data accurately.

The present invention provides a semiconductor memory device and timing control method that performs optimum timing control to accessing the data of memory cells.

One aspect of the present invention is a semiconductor memory device including a memory cell for storing data. A bit line, connected to the memory cell, is used to access the data stored in the memory cell. A first path generates a first timing signal. The first path includes a dummy cell for storing data and a dummy bit line, connected to the dummy cell, for accessing the data stored in the dummy cell. A second path generates a second timing signal. The second path has a delay characteristic that differs from that of the first path. A control circuit controls the timing for accessing data stored in the memory cell using one of the first timing signal and the second timing signal.

Another aspect of the present invention is a semiconductor device including a driver for generating a drive signal. A first path, connected to the driver, generates a first timing signal based on the drive signal. A second path, connected to the driver, generates a second timing signal based on the drive signal. A timing signal generation circuit, connected to the first path and second path, generates a third timing signal at one of a first timing determined by the first timing signal and a second timing determined by the second timing signal. A control circuit, connected to a timing signal generation circuit, controls the operation of the semiconductor device based on the third timing signal.

A further aspect of the present invention is a method for controlling the operation timing of a semiconductor memory device. The semiconductor memory device includes a memory cell for storing data. A bit line, connected to the memory cell, is used to access the data stored in the memory cell. A first path generates a first timing signal. The first path includes a dummy cell for storing data and a dummy bit line, connected to the dummy cell, for accessing the data stored in the dummy cell. The method includes generating a first timing signal using the first path, generating a second timing signal using a second path having a delay characteristic that differs from that of the first path, and controlling the timing for accessing the data stored in the memory cell using one of the first timing signal and the second timing signal.

Another aspect of the present invention is a method for controlling the operation timing of a semiconductor device. The method includes generating a first timing signal at a first timing that changes in accordance with a manufacturing process of the semiconductor device, and generating a second timing signal at a second timing that changes in accordance with the manufacturing process of the semiconductor device. The second timing differs from the first timing. The method further includes receiving the first timing signal and the second timing signal, and controlling the operation of the semiconductor device based on one of the first timing and the second timing.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE
PREFERRED EMBODIMENTS

A static RAM (SRAM) 10 functioning as a semiconductor memory device according to a preferred embodiment of the present invention will now be described with reference to FIGS. 5 through 9.

Figure 5:
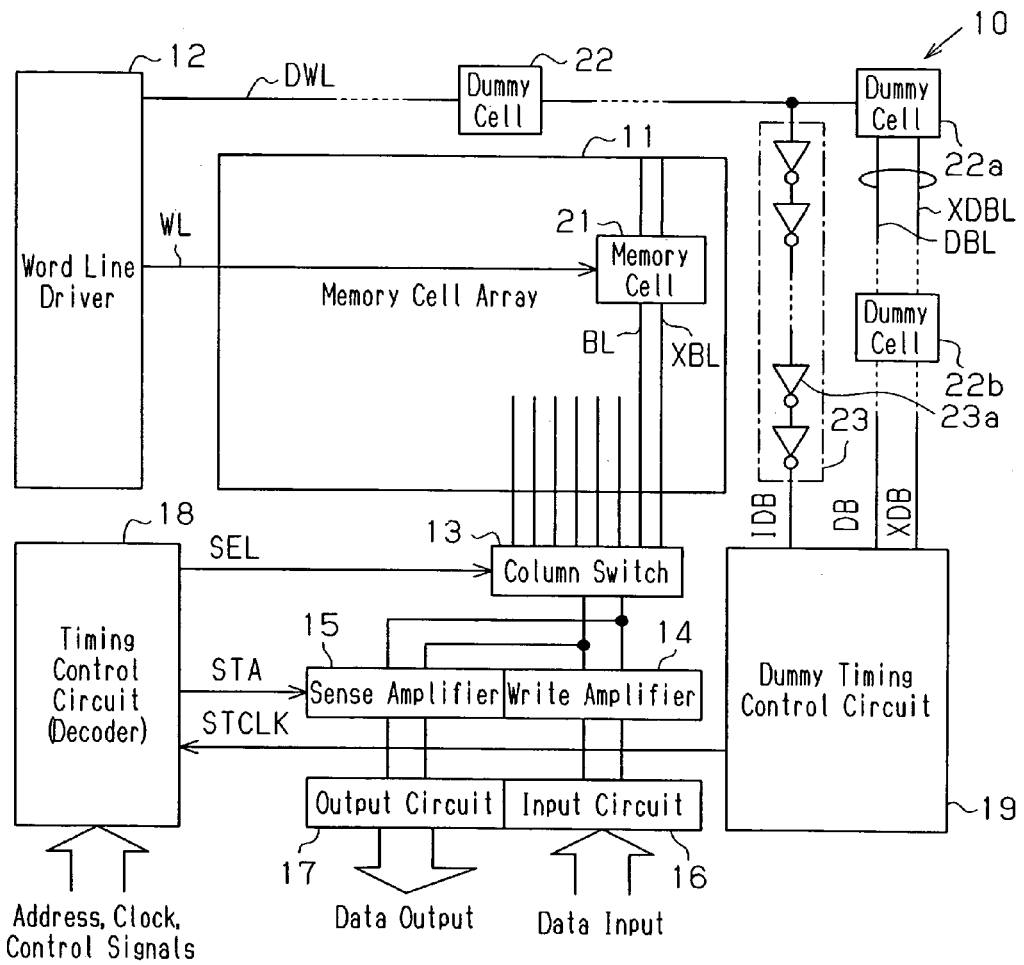
FIG. 5 is a schematic block diagram showing a semiconductor memory device (SRAM) according to a preferred embodiment of the present invention.

FIG. 5 is a block diagram showing the circuit configuration of the SRAM 10 in the preferred embodiment.

The SRAM 10 includes a memory cell array 11, a word line driver 12, a column switch 13, a write amplifier 14, a sense amplifier 15, an input circuit 16, an output circuit 17, a timing control circuit 18, and a dummy timing control circuit 19.

The memory cell array 11 includes a plurality of memory cells 21 arranged in rows and columns to form an array. In the memory cell array 11, a plurality of bit lines (bit line pairs BL/XBL) extend in the direction of the columns of the memory cells 21, and a plurality of word lines WL extend in the direction of the rows of the memory cells 21. A memory cell 21 is provided at the intersection of each word line WL and bit lines BL, XBL. Each memory cell 21 includes a plurality of MOS transistors.

The word line driver 12 is connected to the word lines WL and selectively activates one of the word lines WL based on an address (not shown).

The column switch 13 is connected to the bit lines BL, XBL and to the timing control circuit 18. The column switch 13 receives a selection signal SEL from the timing control circuit 18 and connects a certain bit-line pair BL and XBL to the write amplifier 14 or the sense amplifier 15 based on the selection signal SEL.

The write amplifier 14 is connected to the column switch 13, the input circuit 16, and the timing control circuit 18. Data that is to be written to the memory cell 21 is input to the input circuit 16. The input circuit 16 provides the data to the write amplifier 14. The write amplifier 14 receives an activation signal (not shown) from the timing control circuit 18. The write amplifier 14 is activated by the activation signal to amplify the data received from the input circuit 16 and drive the bit line pair BL and XBL connected through the column switch 13 based on the amplified data. In this way, data is written to the memory cell 21.

The sense amplifier 15 is connected to the column switch 13, the output circuit 17, and the timing control circuit 18. The sense amplifier 15 receives an activation signal STA from the timing control circuit 18. The sense amplifier 15 is activated by the activation signal STA to amplify the potential at the bit line pair BL and XBL connected through the column switch 13, generate an amplified signal, and provide the amplified signal to the output circuit 17. The output circuit 17 outputs the amplified signal as the data stored in the memory cell 21.

Address, clock, and control signal are input to the timing control circuit 18. The timing control circuit 18 includes a decoder for decoding addresses. The timing control circuit 18 executes timing control that is necessary to access data based on the input signals. Further, the timing control circuit 18 generates the selection signal SEL of the column switch 13 and activation signal STA of the sense amplifier 15. The timing control circuit 18 also generates the activation signal for the write amplifier 14 and latch signals for the input circuit 16 and the output circuit 17.

In the preferred embodiment, one dummy word line DWL extends parallel to the word lines WL outside of the memory cell array 11. A plurality of load dummy cells 22, including a self-timing memory cell (read dummy cell) 22a, are connected to the dummy word line DWL. Dummy bit lines (dummy bit line pair DBL/XDBL) are connected to the read dummy cell 22a. A plurality of dummy cells 22b are connected to the dummy bit lines DBL and XDBL. The dummy bit lines DBL and XDBL extend in parallel to the bit lines BL and XBL outside the memory cell array 11. Each of the dummy cells 22, 22a, and 22b includes a plurality of MOS transistors in the same manner as the memory cells 21 of the memory cell array 11.

The dummy bit lines DBL and XDBL are connected to the dummy timing control circuit 19. Complementary dummy signals DB and XDB read from the read dummy cell 22a are provided to the dummy timing control circuit 19 through the dummy bit lines DBL and XDBL.

Figure 1:
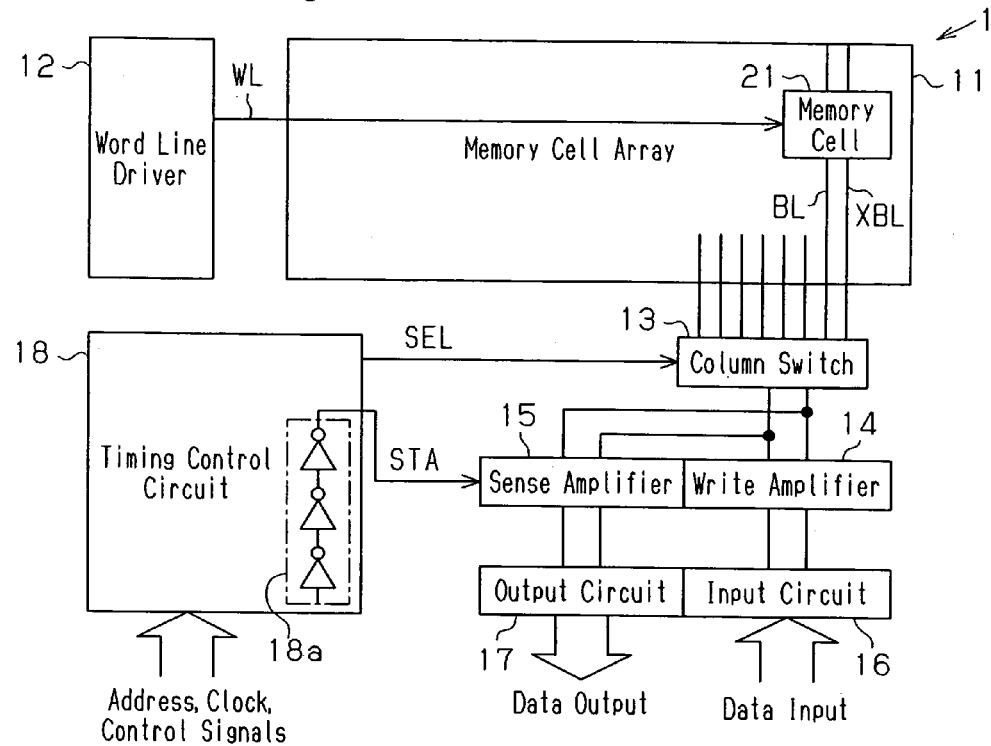
FIG. 1 is a schematic block diagram of a conventional semiconductor memory device.
Figure 2A:
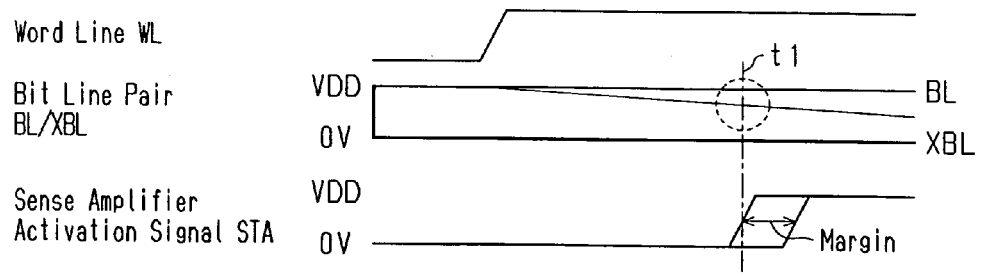
FIGS. 2A and 2B are operation waveform diagrams of the semiconductor memory device of FIG. 1.
Figure 2B:
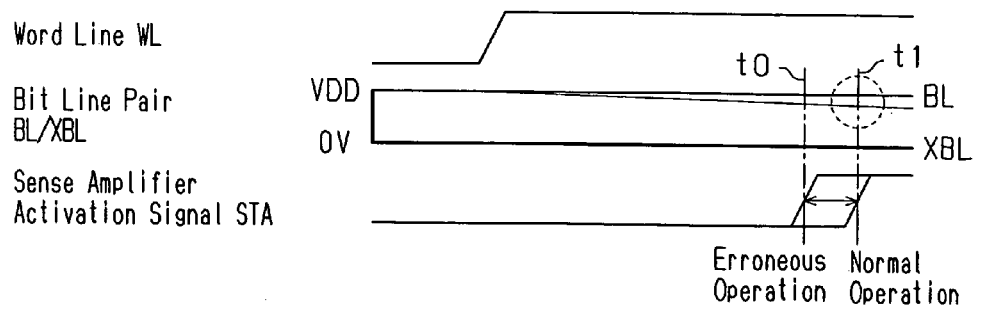
Figure 3:
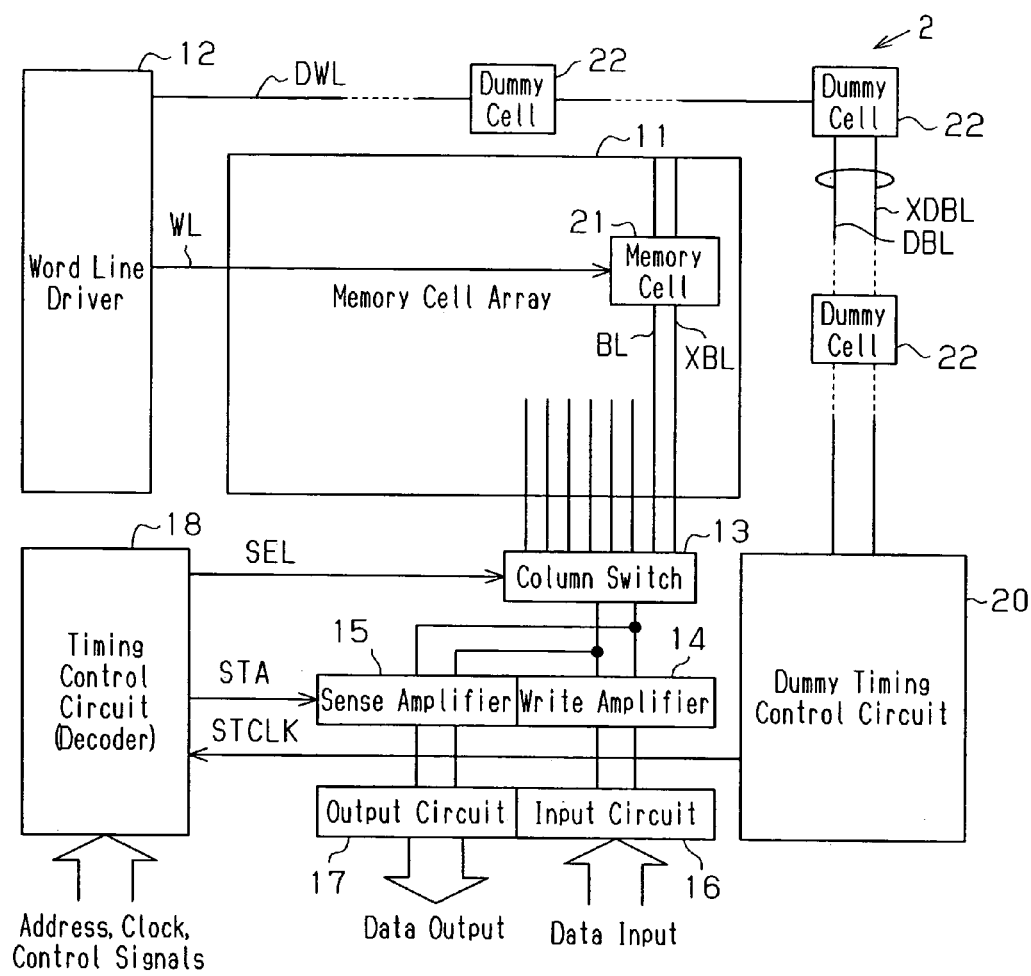
FIG. 3 is a schematic block diagram showing another conventional semiconductor memory device.
Figure 4A:
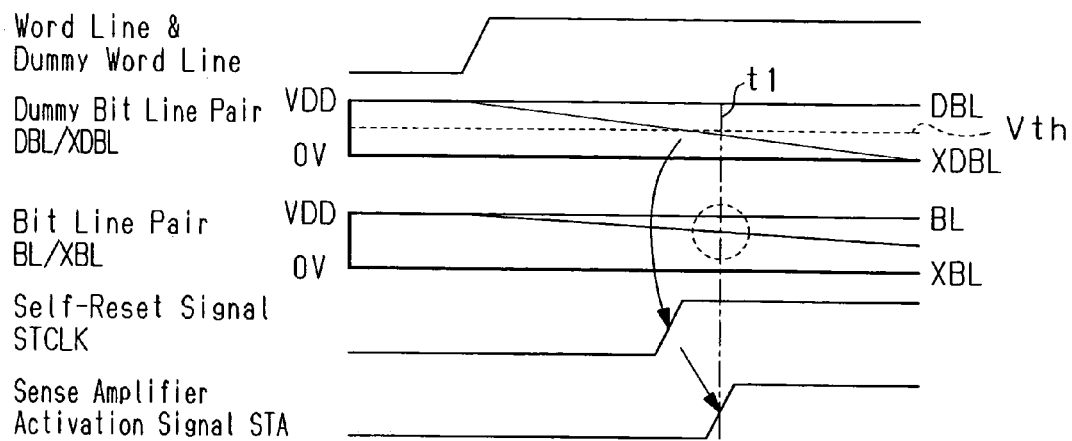
FIGS. 4A and 4B are operation waveform diagrams of the semiconductor memory device of FIG. 3.
Figure 4B:
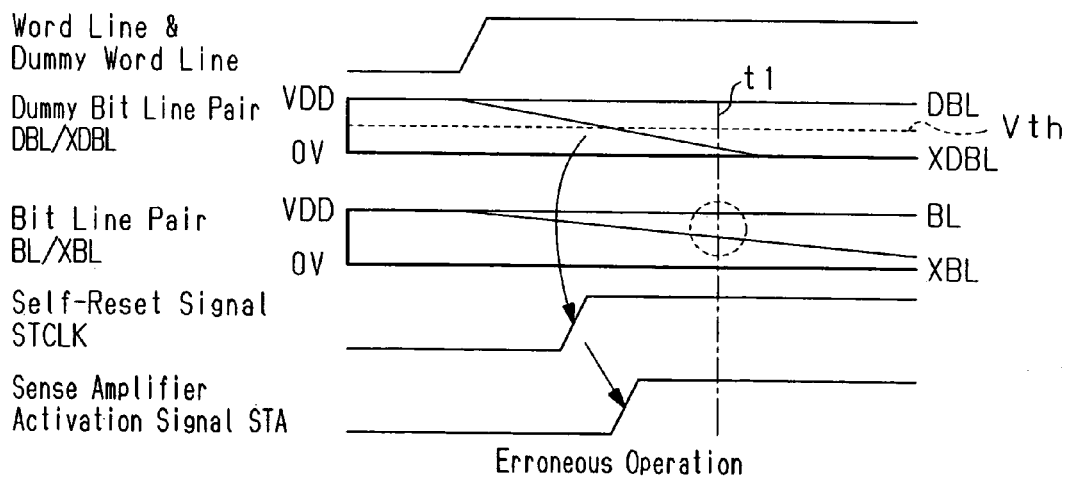

A delay circuit 23 including plural stages of inverter circuits 23a is connected to the dummy word line DWL. The delay circuit 23 provides a delay signal IDB to the dummy timing control circuit 19. The delay time (delay) of the delay circuit 23 is set by the quantity of inverter circuits 23a. Each inverter circuit 23a may be formed from exclusive circuit elements or from MOS transistors forming the dummy cell 22a. When a CMOS inverter circuit is formed using the MOS transistors of the dummy cell 22a, the delay circuit 23 may be formed by just changing the wiring pattern without changing the layout of circuits in the conventional semiconductor memory device 2 (refer to FIG. 3).

Figure 6:
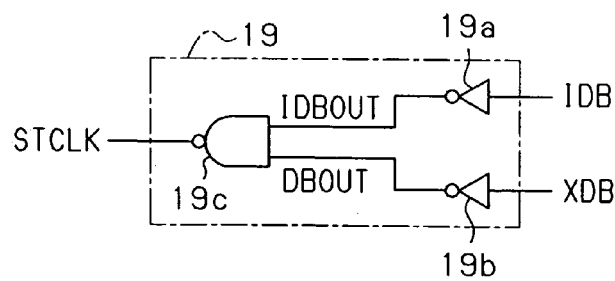
FIG. 6 is a schematic circuit diagram showing a dummy timing control circuit incorporated in the semiconductor memory device of FIG. 5.

FIG. 6 is a circuit diagram of the dummy timing control circuit 19. The dummy timing control circuit 19 is a logic circuit including two inverter circuits 19a and 19b and a NAND circuit 19c. The dummy timing control circuit 19 generates a self-reset signal STCLK based on the delay signal IDB and the dummy signal XDB. More specifically, a first input terminal of the NAND circuit 19c is provided with an inversion signal IDBOUT, which is generated by inverting the signal level of the delay signal IDB through the inverter circuit 19a. A second input terminal of the NAND circuit 19c is provided with an inversion signal DBOUT, which is generated by inverting the signal level of the dummy signal XDB through the inverter circuit 19b. The NAND circuit 19c generates the self-reset signals STCLK in accordance with the signal levels of the inversion signals IDBOUT and DBOUT. That is, when at least one of the delay signal IDB and the dummy signal XDB is high, the dummy timing control circuit 19 (NAND circuit 19c) generates a high self-reset signal STCLK. When both signals are low, the dummy timing control circuit 19 generates a low self-reset signal STCLK. The dummy timing control circuit 19, which is connected to the timing control circuit 18, provides the generated self-reset signal STCLK to the timing control circuit 18.

The timing control circuit 18 keeps the activation signal STA low when the self-reset signal STCLK is high. In this case, the sense amplifier 15 is inactivated. Then, when a low self-reset signal STCLK is received, the timing control circuit 18 supplies a high activation signal STA to the sense amplifier 15 to activate the sense amplifier 15.

In this manner, in the SRAM 10 of the preferred embodiment, two timing signal transmission paths are formed, namely, a first path extending through the dummy circuit including the dummy cells 22 and the dummy bit lines DBL and XDBL, and a second path extending through the delay circuit 23 including the plural stages of inverter circuits 23a. A suitable operating margin is ensured for the activation timing of the sense amplifier 15 by generating the activation signal STA of the sense amplifier 15 based on the timing signals (dummy signal XDB and delay signal IDB) of each path.

In FIG. 5, due to differences arising from the manufacturing process, the time required for the timing signal IDB, which is generated by the delay circuit 23, to shift levels differs from the time required for the timing signal XDB, which is generated by the dummy circuit, to shift levels. Normally, compared to an optimum state in which the manufacturing process is performed in an optimum manner, the timing signal XDB deviates more from the optimum state than the timing signal IDB.

As a result, when differences resulting from the manufacturing process decelerate the operation of a circuit, the timing based on the timing signal XDB is slower than the timing based on the timing signal IDB. Conversely, when differences resulting from the manufacturing process accelerate the operation of a circuit, the timing based on the timing signal IDB is slower than the timing based on the timing signal XDB.

Figure 7:
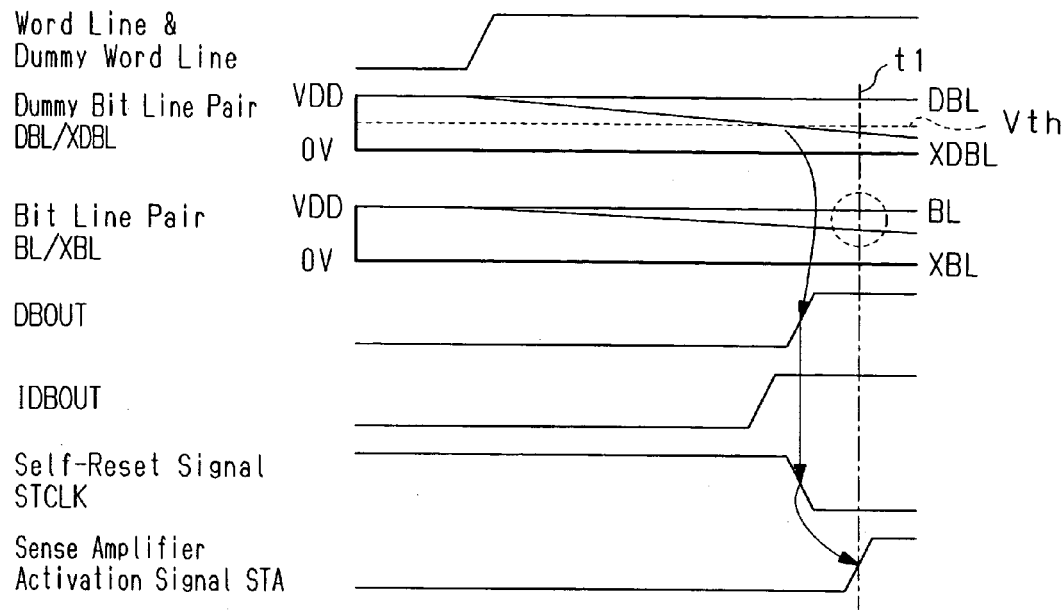
FIG. 7 is an operation waveform diagram of the semiconductor memory device of FIG. 5 when differences resulting from the manufacturing process decelerate the operation of a circuit.

The operation of the SRAM 10 of the preferred embodiment will now be described below with reference to the waveform diagrams of FIGS. 7 and 8. The waveform diagram of FIG. 7 shows the SRAM 10 when its operation is decelerated. The waveform diagram of FIG. 8 shows the SRAM 10 when its operation is accelerated.

Figure 8:
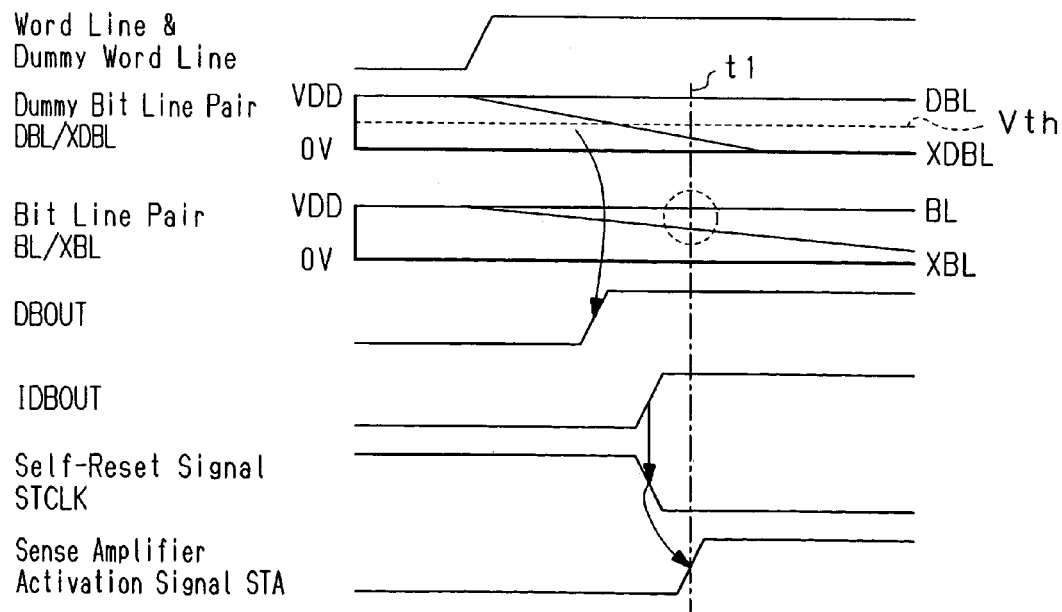
FIG. 8 is an operation waveform diagram of the semiconductor memory device of FIG. 5 when differences resulting from the manufacturing process accelerates the operation of a circuit.

As shown in FIGS. 7 and 8, when the word line driver 12 selects a word line WL (activates the word line WL at the high level), the potential at one of the bit lines BL and XBL (potential of the bit line XBL in FIGS. 7 and 8) gradually decreases to ground level from the high-potential level of the power supply voltage VDD based on the stored data of the memory cell 21. The dummy word line DWL is selected at the same time as the word line WL, and the potential at the dummy bit line DBL gradually decreases to the ground level from the level of the power supply voltage VDD.

The delay circuit 23 keeps the delay signal IDB high until a predetermined time (delay time of the delay circuit 23) elapses after the dummy word line DWL is selected. When the predetermined time elapses, the delay signal IDB goes low, and the inverter circuit 19a of the dummy timing control circuit 19 generates a high inversion signal IDBOUT. The inverter circuit 19b of the dummy timing control circuit 19 generates a high inversion signal DBOUT when the dummy signal XDB of the dummy bit line XDBL becomes lower than a threshold voltage Vth.

If the manufacturing processing decelerates operation, the inversion signal DBOUT of the dummy signal XDB remains low when the inversion signal IDBOUT goes high, as shown in FIG. 7. In this state, the dummy timing control circuit 19 (NAND circuit 19c) generates a high self-reset signal STCLK. Since the timing control circuit 18 provides the sense amplifier 15 with a low activation signal STA based on the high self-reset signal STCLK, the sense amplifier 15 is not activated.

Thereafter, when the voltage of the dummy bit line XDBL becomes lower than the threshold voltage Vth, the inversion signal IDBOUT goes high, and the NAND circuit 19c of the dummy timing control circuit 19 generates a low self-reset signal STCLK. In this state, since the timing control circuit 18 provides the sense amplifier 15 with a high activation signal STA in response to the low self-reset signal STCLK, the sense amplifier 15 is activated at time t1. At time t1, the potential difference between the bit line pair BL and XBL is large enough, and the sense amplifier 15 amplifies the potential difference of the bit line pair BL and XBL to accurately read data.

If the manufacturing process accelerates operation, the reading operation of the dummy cell 22a follows the reading operation of the memory cell 21 and becomes quicker, as shown in FIG. 8. Therefore, the inversion signal DBOUT of the dummy signal XDB goes high before the inversion signal IDBOUT of the delay signal IDB. The dummy timing control circuit 19 (NAND circuit 19c) keeps the self-reset signal STCLK high when the inversion signal DBOUT goes high.

After a predetermined time elapses and the delay signal IDB goes low, the inversion signal IDBOUT goes high, and the dummy timing control circuit 19 (NAND circuit 19c) generates a low self-reset signal STCLK. In this state, since the timing control circuit 18 provides the sense amplifier 15 with a high activation signal STA in response to the self-reset signal STCLK, the sense amplifier 15 is activated at time t1. At time t1, the potential difference between the bit line pair BL and XBL is large enough, and the sense amplifier 15 amplifies the potential difference of the bit line pair BL and XBL to accurately read data.

In this manner, in the SRAM 10 of the preferred embodiment, if the manufacturing process decelerates operation, the sense amplifier 15 is activated based on the timing signal (dummy signal XDB) of the first path extending through the dummy circuit that includes the dummy cell 22a and the dummy bit line pair DBL and XDBL. If the manufacturing process decelerates operation, the operation of the normal bit lines BL and XBL are also delayed in the same manner as the operation of the dummy bit lines DBL and XDBL. In the SRAM 10, there is a large number of the normal. Thus, the memory cells 21 have characteristics that differ over a wide range. Accordingly, there are some memory cells 21 that are slightly delayed from the reading operation of the dummy cells 22. However, when the manufacturing process decelerates operation, the threshold voltage Vth of the dummy timing control circuit 19 (inverter circuit 19b) is increased, and the dummy timing control circuit 19 generates a high self-reset signal STCLK at a slower timing. In this manner, the delay in the operation timing of the memory cells 21 is compensated for. This ensures a further appropriate operation margin with the first path that extends through a dummy circuit including the dummy cell 22a and dummy bit line pair DBL and XDBL.

If the manufacturing process accelerates operation, the sense amplifier 15 is activated based on the timing signal (delay signal IDB) of the second path extending through the delay circuit 23. In this case, the increase of the operation speed of the delay circuit 23 is less than the increase in the potential change speed at the bit line XBL of the memory cell 21. Accordingly, an appropriate operation margin is ensured by the second path that extends through the delay circuit 23.

The SRAM 10 of the preferred embodiment has the advantages described below.

(1) The SRAM 10 incorporates two timing signal transmission paths, namely, a first path extending through the dummy circuit that includes the dummy cells 22 and the dummy bit line pair DBL and XDBL, and a second path extending through the delay circuit that includes the inverter circuits 23a. Accordingly, the activation signal STA is generated at a suitable timing regardless of whether the manufacturing process has resulted in acceleration or deceleration of the SRAM 10. Therefore, a suitable margin is ensured for the activation timing of the sense amplifier 15. Accordingly, erroneous data is prevented from being read by the amplifier 15. This improves the yield of the SRAM 10.

(2) The delay circuit 23 is formed by connecting a plurality of inverter circuits 23a in series. The second path having a delay characteristic differing from that of the first path, which extends through the dummy circuit, is easily formed by using this delay circuit 23.

(3) The delay circuit 23 may be formed by simply changing the wiring pattern without changing the circuit layout of the conventional semiconductor memory device 2 (refer to FIG. 3) by forming a CMOS inverter circuit using the MOS transistors of the dummy cell 22a. Accordingly, the SRAM 10 is cost-efficient.

(4) The dummy timing control circuit 19 is a logic circuit including the inverter circuits 19a and 19b and the NAND circuit 19c. The dummy timing control circuit 19 provides the timing control circuit 18 with a high self-reset signal STCLK at the slower one of the timing when the voltage of the dummy signal XDB becomes lower than the threshold voltage Vth and the timing when the delay signal IDB goes low. Accordingly, the activation signal STA is generated at a suitable timing that is in accordance with differences resulting from the manufacturing process to activate the sense amplifier 15.

It should be apparent to those skilled in the art that the present invention may be embodied in many other specific forms without departing from the spirit or scope of the invention. Particularly, it should be understood that the present invention may be embodied in the following forms.

Figure 9:
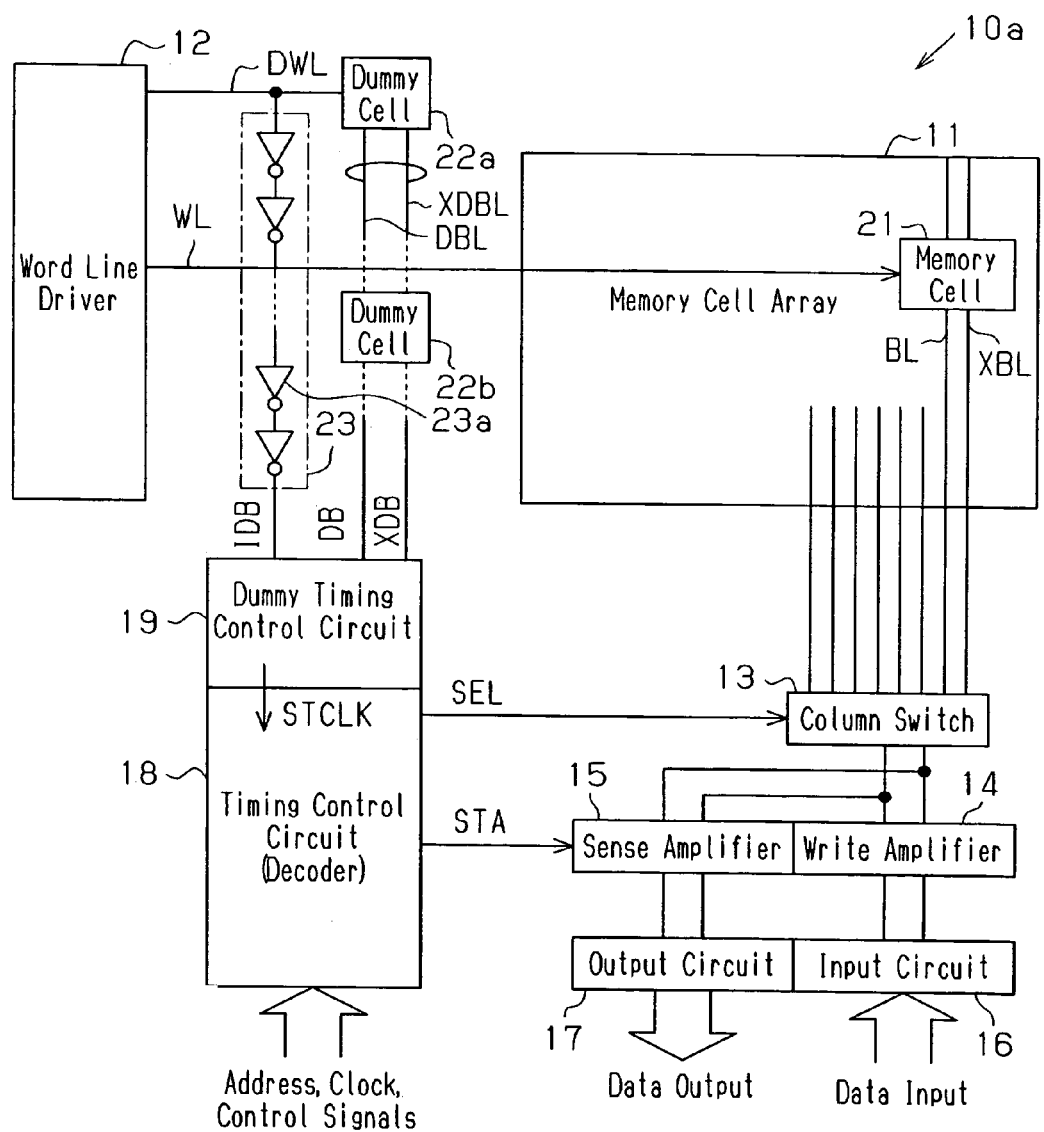
FIG. 9 is a schematic block diagram showing a semiconductor memory device according to a further embodiment of the present invention.

The load dummy cell 22 need not be connected to the dummy word line DWL, as shown in the SRAM 10a of FIG. 9. Furthermore, the dummy bit lines DBL and XDBL need not necessarily be arranged outside of the memory cell array 11 (positioned farthest from the timing control circuit 18). For example, the dummy bit lines DBL and XDBL may be arranged between the memory cell array 11 and the word line driver 12 (positioned near the timing control circuit 18), as shown in FIG. 9. The SRAM 10a has the same advantages as the SRAM 10 of the preferred embodiment.

In the preferred embodiment, the present invention is applied to the activation signal STA of the sense amplifier 15. The present invention is not limited to this arrangement, however, and may be applied to a timing signal for closing the word line WL, or a timing signal for latching the data in the output circuit 17.

In the preferred embodiment, the dummy timing control circuit 19 includes inverter circuits 19a and 19b for respectively receiving the delay signal IDB and the dummy signal XDB. However, the dummy timing control circuit 19 may be modified as required. For example, the dummy timing control circuit 19 may include a gate circuit such as a NAND circuit or NOR circuit.

In the preferred embodiment, the delay circuit 23 of the second path includes plural stages of the inverter circuits 23a. However, the delay circuit 23 may include a gate circuit.

The structure for receiving the dummy signals is not limited to the structure using only one dummy bit line, as shown in FIG. 6. For example, an amplifier such as a differential sense amplifier, a latch sense amplifier, or a current mirror sense amplifier may be used to receive the dummy signals. The amplifier receives the dummy signals DB and XDB of the dummy bit line pair DBL and XDBL as a differential input and generates a detection signal using the potential difference of the dummy signals DB and XDB. The generated detection signal may be used instead of the signal DBOUT of FIG. 6.

In the above embodiment, the present invention is applied to SRAMS 10 and 10a. The present invention may also be applied to memories other than a SRAM. For example, the present invention may be applied to a ferroelectric random access memory (FeRAM).

The present examples and embodiments are to be considered as illustrative and not restrictive, and the invention is not to be limited to the details given herein, but may be modified within the scope and equivalence of the appended claims.

What is claimed is:

1. A semiconductor memory device comprising:
a memory cell for storing data;
a bit line, connected to the memory cell, for accessing the data stored in the memory cell;
a first path for generating a first timing signal, the first path including a dummy cell for storing data and a dummy bit line, connected to the dummy cell, for accessing the data stored in the dummy cell;
a second path for generating a second timing signal, the second path having a delay characteristic that differs from that of the first path; and
a control circuit for controlling the timing for accessing data stored in the memory cell using one of the first timing signal and the second timing signal.

2. The semiconductor memory device of claim 1, wherein the second path includes a delay circuit having a plurality of series-connected inverter circuits.

3. The semiconductor memory device of claim 2, wherein each of the inverter circuits includes a CMOS inverter circuit.

4. The semiconductor memory device of claim 1, wherein the bit line transmits a signal representing the data of the memory cell, the semiconductor memory device further comprising:
a sense amplifier, connected to the control circuit, for amplifying the signal representing the data of the memory cell, the control circuit activating the sense amplifier based on one of the first timing signal and the second timing signal.

5. The semiconductor memory device of claim 1, further comprising:
a logic circuit, connected to the control circuit, for providing the control circuit with a timing signal that is generated by a slower one of the first timing signal and second timing signal.

6. A semiconductor device comprising:
a driver for generating a drive signal;
a first path, connected to the driver, for generating a first timing signal based on the drive signal;
a second path, connected to the driver, for generating a second timing signal based on the drive signal;
a timing signal generation circuit, connected to the first path and second path, for generating a third timing signal at one of a first timing determined by the first timing signal and a second timing determined by the second timing signal; and
a control circuit, connected to a timing signal generation circuit, for controlling the operation of the semiconductor device based on the third timing signal.

7. The semiconductor device of claim 6, wherein the first path includes a dummy cell for storing data and a dummy bit line for connecting the dummy cell to the timing signal generation circuit, and the second path includes a plurality of series-connected inverter circuits.

8. The semiconductor device of claim 6, further comprising:
   a memory cell for storing data;
   a bit line, connected to the memory cell, for transmitting a data signal representing the data of the memory cell; and
   an amplifier, connected to the control circuit, for amplifying the data signal,
   wherein the timing signal generation circuit generates the third timing signal at a slower one of the first timing and the second timing, and
   the control circuit activates the amplifier based on the third timing signal.

9. The semiconductor device of claim 6, wherein the first timing and the second timing change in accordance with a manufacturing process of the semiconductor device, the level of change in the first timing differing from the level of change in the second timing.

10. A method for controlling the operation timing of a semiconductor memory device, the semiconductor memory device including a memory cell for storing data, a bit line, connected to the memory cell, for accessing the data stored in the memory cell, a first path for generating a first timing signal, the first path including a dummy cell for storing data and a dummy bit line, connected to the dummy cell, for accessing the data stored in the dummy cell, the method comprising:
   generating the first timing signal using the first path;
   generating a second timing signal using a second path having a delay characteristic that differs from that of the first path; and
   controlling the timing for accessing the data stored in the memory cell using one of the first timing signal and the second timing signal.

11. A method for controlling the operation timing of a semiconductor device, the method comprising:
   generating a first timing signal at a first timing;
   generating a second timing signal at a second timing, the second timing differing from the first timing; and
   receiving the first timing signal and the second timing signal; and
   controlling the operation of the semiconductor device based on one of the first timing and the second timing.

12. The method of claim 11, wherein said generating a second timing signal includes generating the second timing signal at the second timing so that the level of change in the second timing is smaller than the level of change in the first timing.

* * * * *